(12) United States Patent
Watanabe et al.

(10) Patent No.: US 6,497,761 B2
(45) Date of Patent: Dec. 24, 2002

(54) APPARATUS AND METHOD OF GROWING SINGLE CRYSTAL OF SEMICONDUCTOR

(75) Inventors: Masahito Watanabe, Tokyo (JP); Minoru Eguchi, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/800,027

(22) Filed: Mar. 6, 2001

(65) Prior Publication Data

US 2001/0047749 A1 Dec. 6, 2001

(30) Foreign Application Priority Data

Mar. 6, 2000 (JP) .................................... 2000-059813

(51) Int. Cl.[7] .............................................. C30B 15/20
(52) U.S. Cl. ............................. 117/28; 117/29; 117/30; 117/32; 117/200; 117/917
(58) Field of Search ............................. 117/28, 29, 30, 117/32, 200, 917

(56) References Cited

U.S. PATENT DOCUMENTS

| | | | | |
|---|---|---|---|---|
| 5,178,720 A | * | 1/1993 | Frederick | 117/200 |
| 5,676,751 A | * | 10/1997 | Banan et al. | 117/13 |
| 6,348,095 B1 | * | 2/2002 | Watanabe et al. | 117/13 |

FOREIGN PATENT DOCUMENTS

| | | |
|---|---|---|
| JP | 2930081 | 5/1999 |
| JP | 2950332 | 7/1999 |
| JP | 2959543 | 7/1999 |
| JP | 11-2639691 | 9/1999 |

* cited by examiner

Primary Examiner—Felisa Hiteshew
(74) Attorney, Agent, or Firm—Dickstein, Shapiro, Morin & Oshinsky LLP

(57) ABSTRACT

An apparatus for growing a single crystal of semiconductor is provided, which makes it possible to grow a heavy single crystal of semiconductor of 100 kg or greater in weight even if a growing single crystal contains a neck. In the apparatus, the first and second electrodes are provided such that the first ends of the first and second electrodes are electrically connected to the power supply and the second ends of the first and second electrodes are contacted with the melt in the crucible. During the growth process, a specific voltage is applied across the first ends of the first and second electrodes, thereby forming the electrical current path interconnecting the second ends of the first and second electrodes in the melt. The magnetic field is generated with the magnetic field generator to intersect with the electrical current path in the melt. No electric current flows through the growing single crystal from the melt.

42 Claims, 7 Drawing Sheets

APPARATUS AND METHOD OF GROWING SINGLE CRYSTAL OF SEMICONDUCTOR

BACKGROUND OF THE INVENTION

1. Field of the Invention

The present invention relates to the technique for growing single crystal of semiconductor such as silicon (Si) using the well-known Czochralski growth method and more particularly, to an apparatus for and a method of growing a single crystal of semiconductor, in which magnetic field is applied to a melt of semiconductor in a rotating crucible while an electric current is supplied to the melt so as to intersect with the magnetic field, thereby growing a single crystal of semiconductor from its seed crystal.

2. Description of the Related Art

Single-crystal semiconductor wafers, which have been used as substrates of ultralarge-scale integrated electronic devices (ULSIs), are produced from an ingot of a single crystal of semiconductor (e.g., Si). An ingot of a single crystal of semiconductor is typically obtained by crystal growth from a semiconductor melt using the Czochralski method.

In the Czochralski method, conventionally, a desired single crystal of semiconductor is pulled up vertically from a rotating melt of the same semiconductor in a horizontal plane using a seed crystal while the growing single crystal is rotated in an opposite direction to the melt. The melt is held in a crucible and is applied with heat from a heater mounted around the crucible. The crucible containing the melt is mechanically rotated in a horizontal plane in the whole growth process. This is to make the temperature distribution in the melt axisymmetrical to the vertical pull shaft for the crystal (i.e., the growth axis of the crystal). Due to the mechanical rotation of the crucible, the concentration of dopant or dopants introduced into the crystal varies.

Also, the concentration of dopant(s) introduced into the growing crystal varies due to segregation at the interface of the growing crystal and the melt as the growth time increases. Thus, unless the dopant concentration is well controlled, it tends to differ conspicuously from each other between the early and later stages of the crystal growth process. Taking this disadvantage into consideration, both the crystal and the crucible are rotated so as to uniformize the dopant concentration in the crystal thus grown.

With the above-described conventional Czochralski method where the crystal and the crucible are mechanically rotated in the growth process, there is a tendency that the rotation of the growing crystal becomes more difficult with the increasing diameter of the crystal. In particular, this tendency induces a serious problem in the crystal growth of silicon.

Specifically, the crucible made of fused silica is used for growing single crystal of silicon and therefore, oxygen existing in silica tends to dissolve into the growing crystal. For this reason, the concentration of oxygen needs to be well controlled along with the concentration of intended dopant during the growth process. In the above-described conventional method where the crystal and the crucible are mechanically rotated, however, it is difficult to suppress the axial fluctuation of the dopant concentration along the pull shaft in the growing crystal within 1%. Also, to mechanically rotate the large-diameter crucible, a large-scale apparatus or subsystem is necessary. As a result, it has been becoming more difficult to grow a large-diameter single crystal of silicon.

The difficulty in the above-described conventional method can be solved by the technique disclosed in the Japanese Patent No. 2,959,543 issued in October 1999, which was created by the inventors of the present invention, M. Watanabe and M. Eguchi. With the technique disclosed in this patent, a specific magnetic field is applied to a melt of semiconductor and at the same time, electric current is supplied to the melt so as to be perpendicular to the magnetic field. Thus, the radial fluctuation of dopant concentration in a grown crystal is uniformized.

FIG. 1 shows the configuration of the prior-art semiconductor crystal growth apparatus disclosed in the above-identified Japanese Patent No. 2,959,543.

As shown in FIG. 1, the prior-art apparatus comprises a crystal growth furnace 120 with a chamber 109, a coil unit 110 for generating a specific magnetic field which is mounted to surround the furnace 120, and a power supply 104 provided outside the furnace 120. In the chamber 109, a crucible 105 and a heater 108 are mounted. The heater 108 is located to surround the crucible 105. The heater 108 is used to heat a semiconductor raw material in the crucible 105, thereby producing a melt 102 of the semiconductor in the crucible 105. The crucible 105 is used to hold the semiconductor raw material and the melt 102 therein. FIG. 1 shows the state where the melt 102 has been produced with the heater 108 and is held in the crucible 105.

A vertical pull or lift shaft 106, which is made of an electrically conductive material, is provided over the crucible 105. Similar to the ordinary Czochralski method, a seed crystal (not shown) is attached to the bottom end of the shaft 106. The top end of the shaft 106 is supported by a pull or lift mechanism 112. The mechanism 112 serves to pull up or lift vertically the shaft 106 (i.e., a growing single crystal 101 of semiconductor) while rotating the shaft 106 around its axis (i.e., the pull or growth axis).

The coil unit 110 is electrically connected to a power supply (not shown) and is supplied with a specific electric current. Thus, the unit 110 generates a specific magnetic field 111 in the crucible 105.

Electrodes 103 are vertically provided near the crucible 105 so as to be arranged axisymmetrical to the shaft 106. The bottoms of the electrodes 103 are immersed in the melt 102. In FIG. 1, only one of the electrodes 103 is shown for simplification.

One of the two output terminals of the dc power supply 104 is electrically connected in common to the top ends of the electrodes 103 by way of an ammeter 121. The other of the output terminals of the supply 104 is electrically connected to the shaft 106 by way of a resistor 122. A voltmeter 123 is electrically connected in parallel to the resistor 122.

With the prior-art apparatus shown in FIG. 1 having the above-described configuration, in the growth process, the semiconductor raw material is supplied into the crucible 105 and heated with the heater 108, producing the melt 102 of semiconductor in the crucible 105. A bar-shaped single crystal 101 of semiconductor is grown by pulling the seed crystal up from the melt 105 thus produced using the shaft 106. At this time, to prevent the dislocations existing in the seed crystal from propagating to the single crystal 101, a so-called "neck" 107 is formed between the seed crystal and the top end of the growing single crystal 101. The neck 107 is a constricted part of the crystal 101 and is formed at the initial stage of the growth process.

During the growth process of the crystal 101, the coil unit 110 is supplied with a specific electric current from the power supply, thereby generating the magnetic field 111 in the chamber 109. The magnetic field 111 thus generated is perpendicular to the interface of the melt 102 and the crystal 101 and axisymmetrical to the shaft 106 in the crucible 105.

Moreover, a specific dc voltage is applied across the electrodes 103 and the pulling shaft 106 by the power supply 104, thereby supplying a specific electric current to the melt 102 existing in the crucible 105. The electric current thus supplied flows through the melt 102, resulting in the Lorentz force applying to the melt 102.

Thus, rotational forces centering on the pulling shaft 106 (i.e., the growth axis) are generated in the melt 102, causing rotation of the melt 102 around the shaft 106 in the crucible 105. As a result, because of stir of the melt 102 by its rotation, the radial fluctuation of the dopant concentration in the grown crystal 101 is uniformized.

Furthermore, the Japanese Patent Nos. 2,950,332 issued in September 1999, 2,885,240 issued in April 1999, and 2,930,081 issued in August 1999 disclose the following techniques relating to the crystal growing apparatus shown in FIG. 1.

In the technique disclosed in the Japanese Patent No. 2,950,332, at least one of the magnetic field applied to the melt of semiconductor and the electric current supplied to the melt is suitably adjusted. Thus, the axial fluctuation of dopant concentration is uniformized.

In the technique disclosed in the Japanese Patent No. 2,885,240, the electrodes, the bottom ends of which are immersed into the melt, are made of the same semiconductor material as the single crystal to be grown. Thus, the introduction of impurity other than the intended dopant into the single crystal is suppressed.

In the technique disclosed in the Japanese Patent No. 2,930,081, the electrodes, which are used to supply the electric current to the melt and the bottom ends of which are immersed into the melt, are respectively inserted into tubes made of the same semiconductor material as the single crystal to be grown. Thus, the symmetry degradation of the temperature distribution in the melt, which is induced by inserting the electrodes into the melt, is prevented from degrading. As a result, the radial distribution of dopant in the single crystal is uniformized.

With the recent crystal growth methods using the Czochralski growth method, generally, as described earlier, "constriction" of the crystal 101 is performed to prevent the single crystal 101 from containing dislocations. Therefore, the neck 107 is essentially formed between the growing single crystal 101 and the seed crystal. However, it was found that the neck 107 causes the following problem.

With the prior-art apparatus shown in FIG. 1, the electric current supplied by the power supply 104 flows into the melt 101 of semiconductor through the growing crystal 101 and the shaft 106 and therefore, heat generation occurs at the neck 107. This is due to the fact that the neck 107 is higher in electrical resistance than its remaining part. Accordingly, as the pull or lift length of the crystal 101 becomes large and its weight increases, there is an increase danger that the heated neck 107 will break.

For example, when the crystal 101 is single-crystal silicon, it will be 100 kg or greater in weight if it is 20 cm in diameter and 150 cm or more in length. Similarly, the single-crystal silicon crystal 101 is as large in diameter as 30 cm or more in length. In this case, the prior-art apparatus shown in FIG. 1 is unable to pull up the single-crystal silicon crystal 101 as heavy as 100 kg or more having, for example, the above dimensions.

This is applicable to the techniques disclosed in the above-described Japanese Patent Nos. 2,950,332, 2,885,240, and 2,930,081 as well.

SUMMARY OF THE INVENTION

Accordingly, an object of the present invention is to provide an apparatus for and a method of growing a single crystal of semiconductor that make it possible to pull up (i.e., grow) a heavy single crystal of semiconductor of 100 kg or greater in weight even if a growing single crystal contains the neck.

Another object of the present invention is to provide an apparatus for and a method of growing a single crystal of semiconductor that prevent the neck of a growing single crystal from generating heat due to an electric current flowing through the neck.

Still another object of the present invention is to provide an apparatus for and a method of growing a single crystal of semiconductor that prevent the neck of a growing single crystal from breaking due to the own weight of the crystal during the growing process.

A further object of the present invention is to provide an apparatus for and a method of growing a single crystal of semiconductor that make it possible to pull up (i.e., grow) a heavy single crystal of semiconductor of 100 kg or greater in weight while the radial and axial dopant concentrations in the single crystal are kept substantially uniform.

The above objects together with others not specifically mentioned will become clear to those skilled in the art from the following description.

According to a first aspect of the present invention, an apparatus for growing a single crystal of semiconductor using the Czochralski method is provided. This apparatus comprises:

(a) a crucible for holding a melt of semiconductor;

(b) a heater for heating the crucible;

(c) a pulling mechanism for pulling up a single crystal of semiconductor from the melt held in the crucible using a seed crystal;

(d) a first power supply having a first terminal and a second terminal;

(e) a first electrode having a first end and a second end; the first end of the first electrode being electrically connected to the first terminal of the first power supply;

the second end of the first electrode being designed to contact the melt held in the crucible;

(f) a second electrode having a first end and a second end; the first end of the second electrode being electrically connected to the second terminal of the first power supply;

the second end of the second electrode being designed to contact the melt held in the crucible;

(g) a magnetic field generator for generating a magnetic field in the melt held in the crucible;

wherein in a growth process, a specific voltage is applied across the first ends of the first and second electrodes with the power supply, thereby forming an electrical current path interconnecting the second ends of the first and second electrodes in the melt held in the crucible;

and wherein a magnetic field is generated with the magnetic field generator to intersect with the electrical current path in the melt held in the crucible in the growth process;

and wherein the single crystal is grown to form a neck between the seed crystal and a head end of the single crystal;

With the apparatus according to the first aspect of the present invention, the first and second electrodes are provided in such a way that the first ends of the first and second electrodes are electrically connected to the first power supply and the second ends of the first and second electrodes are contacted with the melt in the crucible.

Also, during the growth process, a specific voltage is applied across the first ends of the first and second electrodes, thereby forming the electrical current path interconnecting the second ends of the first and second electrodes in the melt. The magnetic field is generated with the magnetic field generator to intersect with the electrical current path in the melt.

Accordingly, during the growth process, an electric current flows into the melt through the first electrode and flows out of the melt through the second electrode, and vice versa. This means that no electric current flows through the growing single crystal from the melt. Thus, no heat generation occurs at the neck formed between the seed crystal and the head end of the single crystal even if the single crystal is grown under flow of the melt induced by interaction between the magnetic field and the electric current. This prevents the neck of the growing single crystal from breaking due to the own weight of the single crystal during the growing process.

As a result, with the apparatus according to the first aspect of the invention, a heavy single crystal of semiconductor of 100 kg or greater in weight can be pulled up (i.e., grown) even if the growing single crystal contains the neck. Moreover, the heavy single crystal of semiconductor can be grown while the radial and axial concentrations of dopant in the single crystal are kept substantially uniform.

In a preferred embodiment of the apparatus according to the first aspect of the invention, the second ends of the first and second electrodes are designed to contact with a surface of the melt held in the crucible. The magnetic field generated with the magnetic field generator is approximately perpendicular to the surface of the melt.

In this embodiment, it is preferred that the first and second electrodes are arranged to be axisymmetrical to a pull-up axis of the pulling mechanism.

According to a second aspect of the present invention, a method of growing a single crystal of semiconductor using the Czochralski method is provided. This method comprises the steps of:

(a) providing a melt of semiconductor held in a crucible using a heater;

(b) providing a first power supply having a first terminal and a second terminal;

(c) providing a first electrode having a first end and a second end in such a way that the first end of the first electrode is electrically connected to the first terminal of the first power supply and the second end of the first electrode contacts the melt held in the crucible;

(d) providing a second electrode having a first end and a second end in such a way that the first end of the second electrode is electrically connected to the second terminal of the first power supply and the second end of the second electrode contacts the melt held in the crucible;

(e) applying a specific voltage across the first ends of the first and second electrodes with the power supply, thereby forming an electrical current path interconnecting the second ends of the first and second electrodes in the melt held in the crucible;

(f) generating a magnetic field to intersect with the electrical current path formed in the melt held in the crucible;

(g) pulling up a seed crystal from the melt held in the crucible along a specific growth axis, thereby growing a single crystal of semiconductor from the melt while a neck is formed between the seed crystal and a head end of the growing single crystal.

With the method according to the second aspect of the present invention, because of the same reason as shown in the apparatus according to the first aspect of the invention, the same advantages as those in the apparatus are given.

In a preferred embodiment of the method according to the second aspect of the invention, no electric current is supplied to the single crystal during a whole growth process of the single crystal.

In this embodiment, it is preferred that at least one of an electric current flowing through the electric current path formed in the melt and the magnetic field generated in the melt is adjusted to uniformize a dopant concentration in the single crystal in the growth process of the single crystal.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
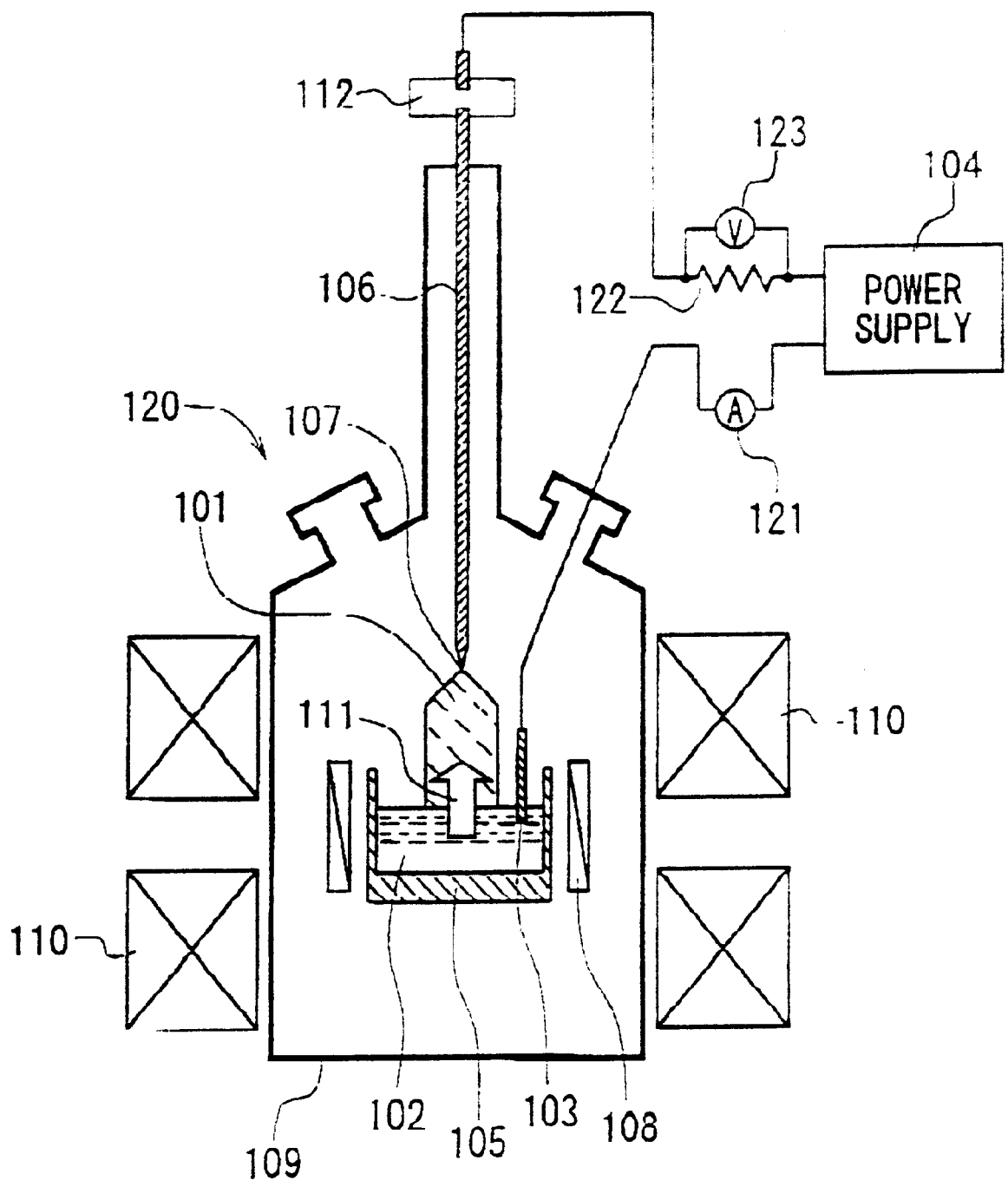
FIG. 1 is a schematic cross-sectional view showing the configuration of a prior-art semiconductor crystal growth apparatus.

Preferred embodiments of the present invention will be described in detail below while referring to the drawings attached.

FIRST EMBODIMENT

Figure 2:
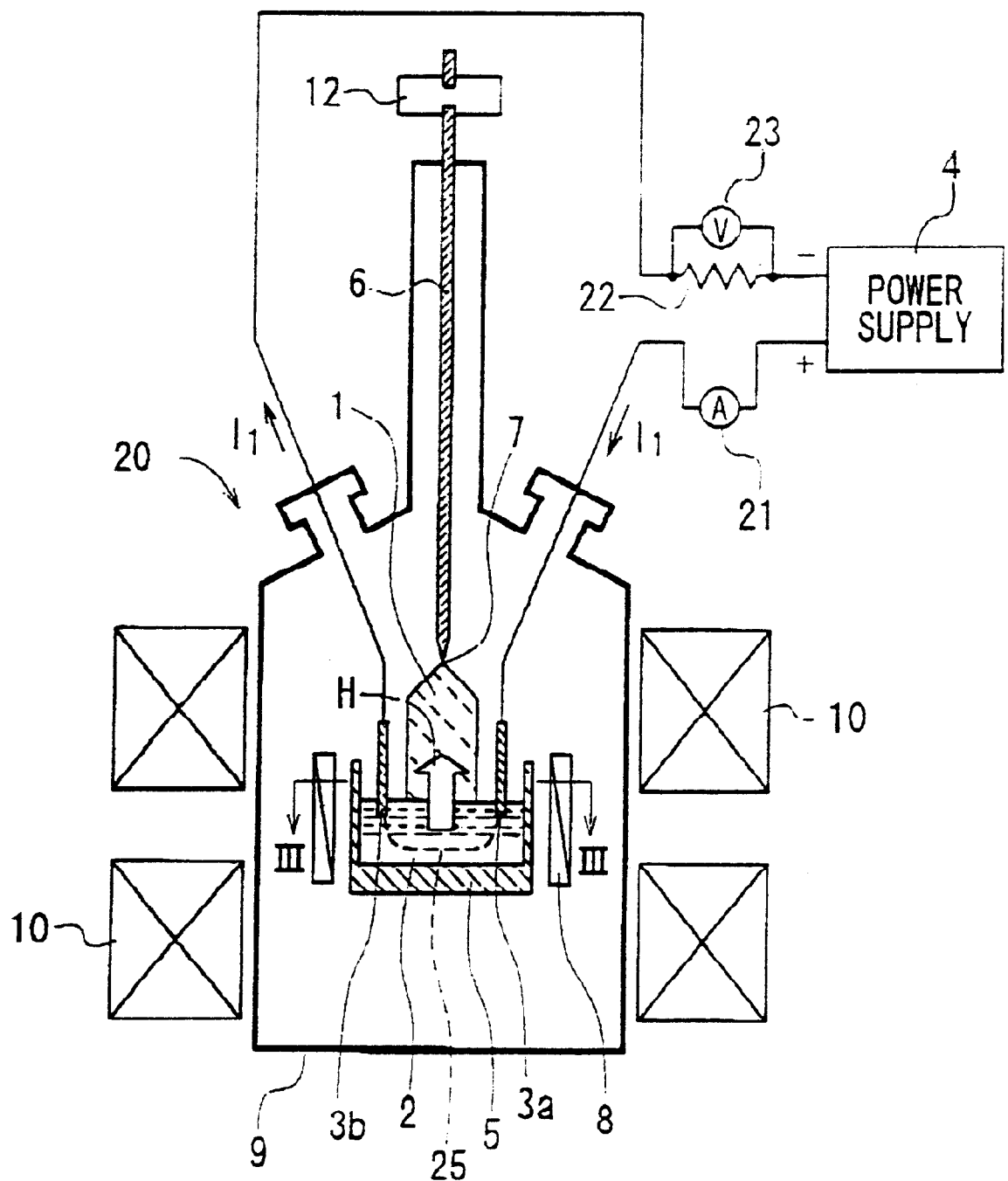
FIG. 2 is a schematic cross-sectional view showing the configuration of a semiconductor crystal growth apparatus according to a first embodiment of the invention.
Figure 3:
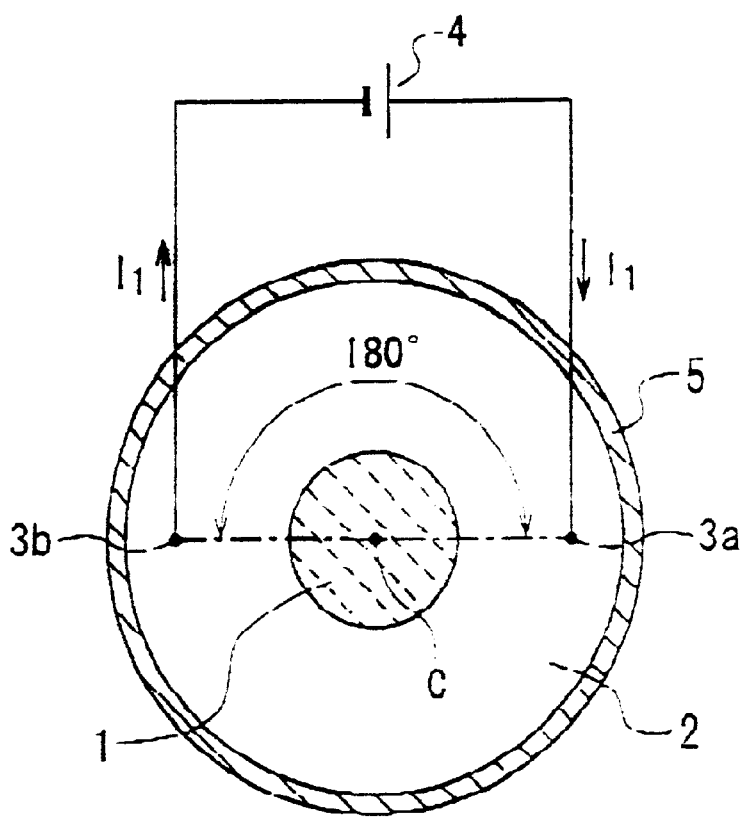
FIG. 3 is a schematic, partial cross-sectional view taken along the line III—III in FIG. 2, which shows the arrangement of the electrodes with respect to the growth axis or pull shaft.

As shown in FIGS. 2 and 3, a semiconductor crystal growth apparatus according to a first embodiment of the invention comprises a crystal growth furnace 20 with a chamber 9, a coil unit 10 for generating a specific magnetic field which is mounted to surround the furnace 20, and a dc (i.e., direct current) power supply 4 provided outside the furnace 20. In the chamber 9, a crucible 5 and a heater 8 are mounted. The heater 8, which is located so as to surround the crucible 5, is used to heat a semiconductor raw material in the crucible 5, thereby producing a melt 2 of the semiconductor, such as silicon (Si) in the crucible 5. The crucible 5 is used to hold the semiconductor raw material and the melt 2 therein. FIG. 2 shows the state where the melt 2 has been produced with the heater 8 and is held in the crucible 5.

Figure 11:
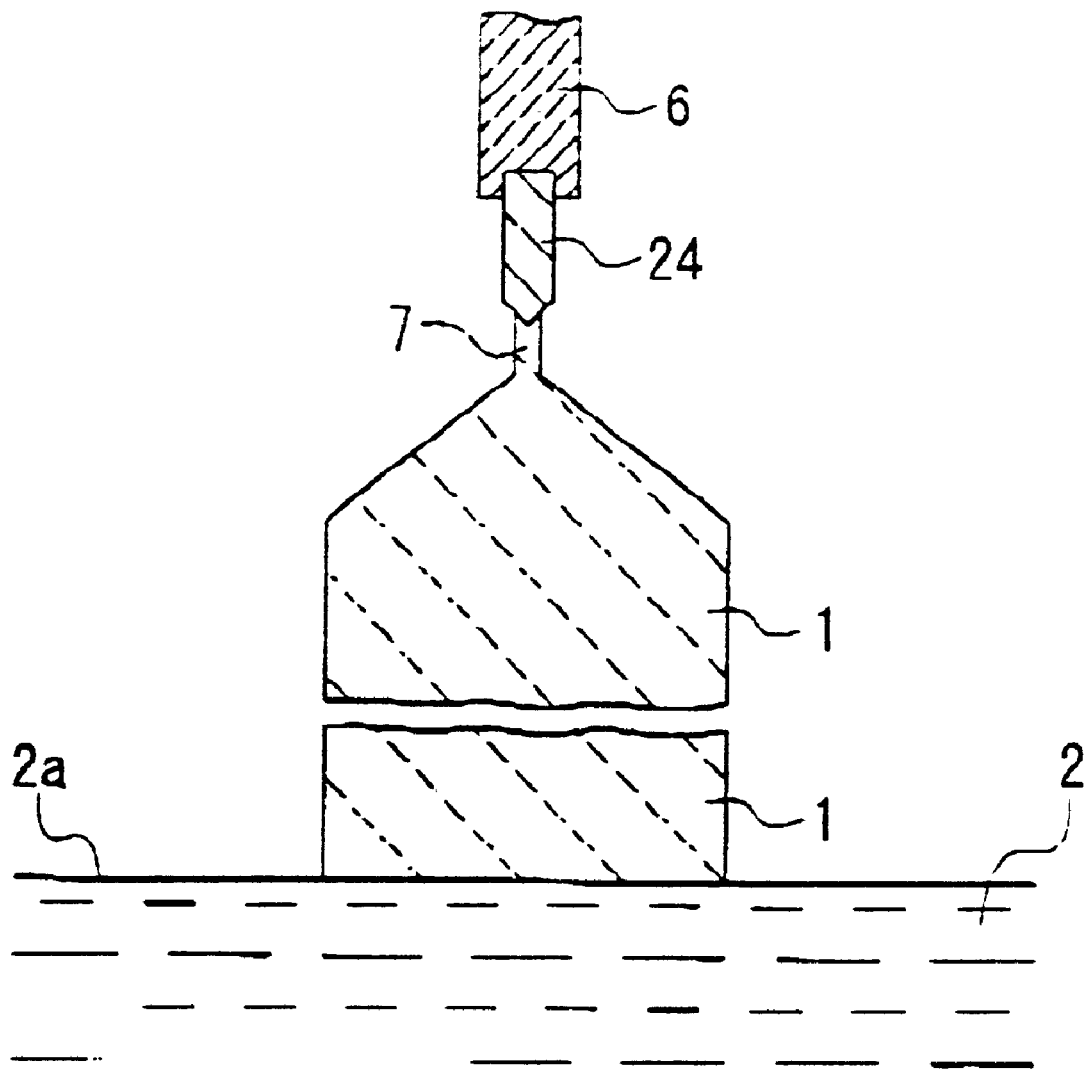
FIG. 11 is a schematic, enlarged, partial cross-sectional view showing the holding state of the seed crystal and the top end of the growing single crystal of semiconductor in the apparatuses according to the first to fourth embodiments, in which the neck is clearly shown.

A vertical pull or lift shaft 6, which is made of an electrically conductive material, is provided over the crucible 5. Similar to the ordinary Czochralski method, as shown in FIG. 11, a seed crystal 24 of the same semiconductor as a single crystal 1 of semiconductor is attached to the bottom end of the shaft 6. The top end of the shaft 6 is supported by a pulling mechanism 12. The mechanism 12 serves to pull up or lift vertically the shaft 6 (i.e., the growing single crystal 1 of semiconductor) while rotating the shaft 6 around its axis (i.e., the pull or growth axis).

The coil unit 10 is electrically connected to a power supply (not shown) and is supplied with a specific electric current from the power supply. Thus, the unit 10 generates a specific magnetic field H in the crucible 5 (i.e., in the melt 2). The magnetic field H is perpendicular to the surface 2a of the melt 2 (i.e., the interface of the melt 2 and the crystal 1), as shown in FIG. 11.

Two electrodes 3a and 3b are provided vertically near the crucible 5 in such a way as to be located at an angle of 180° around the lift or growth axis C (i.e., the central axis of the shaft 6), as clearly shown in FIG. 3. In other words, the electrodes 3a and 3b are arranged axisymmetrical to the axis C and perpendicular to the surface 2a of the melt 2. The bottom ends of the electrodes 3a and 3b are kept being immersed in the melt 2 during the whole growth process, as shown in FIG. 2. When a specific electric current is supplied to the electrodes 3a and 3b, an electrical current path 25 is formed to interconnect the bottom ends of the electrodes 3a and 3b in the melt 2, as shown in FIG. 2.

The top end of the electrode 3a is electrically connected to the positive output terminal of a dc power supply 4 by way of an ammeter 21 for measuring the electrical current flowing through the electrodes 3a and 3b. The power supply 4 is provided outside the furnace 20. The top end of the electrode 3b is electrically connected to the negative output terminal of the same power supply 4 by way of a resistor 22. A voltmeter 23 for measuring the voltage across the two ends of the resistor 22 is connected in parallel to the resistor 22.

Preferably, the electrodes 3a and 3b are made of the same semiconductor material as the single crystal 1 to be grown. In this case, there is an advantage that unintended (i.e., unwanted) impurity is prevented from doping into the melt 2 (and therefore, into the crystal 1 thus grown) from the electrodes 3a and 3b.

Preferably, the same dopant or dopants as that/those doped into the crystal 1 to be grown is/are introduced into the electrodes 3a and 3b. In this case, there is an additional advantage that dopant introduction into the crystal 1 to be grown is stably conducted.

With the semiconductor crystal growth apparatus according to the first embodiment shown in FIGS. 1 and 2, a desired semiconductor raw material is supplied into the crucible 5 and heated with the heater 8, producing the melt 2 of semiconductor in the crucible 5. A bar-shaped single crystal 1 (i.e., ingot) of semiconductor is grown by pulling the seed crystal 24 up from the melt 5 thus produced using the shaft 6 until the crystal 1 has a desired diameter and a desired length.

At the initial stage of the growth process, to prevent the dislocations existing in the seed crystal 24 from propagating to the single crystal 1, a neck 7 (i.e., a constricted part of the crystal 1) is formed between the seed crystal 24 and the top end of the growing crystal 1, as shown in FIG. 11.

During the whole growth process of the single crystal 1, the coil unit 10 is supplied with a specific electric current from the power supply (not shown), thereby generating the specific magnetic field H in the crucible 5 in the chamber 9. The magnetic field H thus generated is perpendicular to the surface 2a of the melt 2 (i.e., the interface of the melt 2 and the crystal 1) and axisymmetrical to the shaft 6 (i.e., the growth axis C) in the crucible 5.

Moreover, a specific dc voltage is applied across the electrodes 3a and 3b by the dc power supply 4, thereby supplying a specific electric current $I_1$ to the melt 2 held in the crucible 5. The electric current $I_1$ thus supplied flows through the electrical current path 25 formed in the melt 2, resulting in the Lorentz force applying to the melt 2. Thus, rotational forces centering on the pulling shaft 6 (i.e., the growth axis C) are generated in the melt 2, causing rotation of the melt 2 around the axis C in the crucible 5. Due to the rotation of the melt 2, the melt 2 itself is stirred. As a result, the radial and axial fluctuation of the dopant concentration in the grown crystal 1 is uniformized.

The electric current path 25 shown in FIG. 2 is schematic illustration and therefore, the invention is not limited to the form of the path 25. The path 25 may have any other form. For example, the path 25 may be formed by the entire melt 2.

Figure 4:
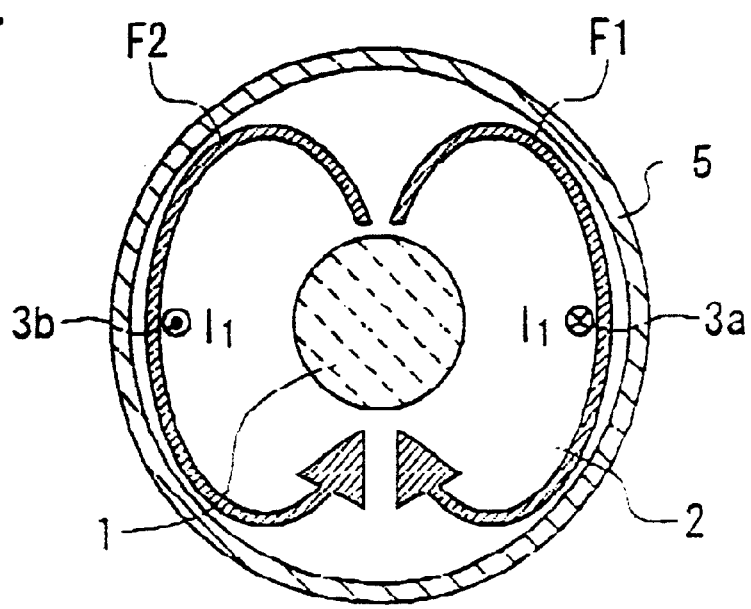
FIG. 4 is a schematic, partial cross-sectional view showing the flowing orientation of the melt of semiconductor in the crucible and the orientation of the electric current flowing through the electrodes in the apparatus according to the first embodiment of FIGS. 2 and 3.

FIG. 4 shows schematically the observed state of the rotational flow of the melt 2 held in the crucible 5. This was given by the inventors' test, where the inventors floated specific tracer particles on the surface 2a of the melt 2 of silicon and then, observed the motion of the particles.

As seen from FIG. 4, the electric current $I_1$ enters vertically the melt 2 by way of the electrode 3a and emits vertically from the melt 2 by way of the electrode 3b while the magnetic field H is perpendicular to the surface 2a of the melt 2. Thus, the melt 2 is applied with the Lorentz force due to interaction between the electric current $I_1$ and the magnetic field H, generating the rotational forces centering on the growth axis C in the melt 2. Due to these rotational forces, the rotational flows F1 and F2 of the melt 2 occur around the axis C and accordingly, the melt 2 is stirred. As a result, the radial and axial fluctuation of the dopant concentration in the grown crystal 1 is well uniformized.

In the growth process, at least one of the electric current $I_1$ and the magnetic field H is suitably adjusted to uniformize the dopant concentration of the crystal 1.

With the crystal growth apparatus according to the first embodiment of the invention, as described above, the electrodes 3a and 3b are provided in such a way that the top ends of the electrodes 3a and 3b are electrically connected to the dc power supply 4 and the bottom ends thereof are contacted with the melt 2 in the crucible 5.

Also, during the growth process, a specific voltage is applied across the top ends of the electrodes 3a and 3b, thereby forming the electrical current path 25 interconnecting the bottom ends of the electrodes 3a and 3b in the melt 2. The magnetic field H is generated with the coil unit 10 to be perpendicular to the surface 2a of the melt 2.

Accordingly, during the growth process, the electric current $I_1$ flows into the melt 2 through the electrode 3a and flows out of the melt 2 through the electrode 3b. This means that no electric current flows through the growing single crystal 1 from the melt 2. Thus, no heat generation occurs at the neck 7 formed between the seed crystal 24 and the head end of the single crystal 1 even if the single crystal 1 is grown under flows F1 and F2 of the melt 2 induced by interaction between the magnetic field H and the electric current $I_1$. This prevents the neck 7 of the growing single crystal 1 from breaking due to the own weight of the crystal 1 during the growing process.

As a result, with the apparatus according to the first embodiment of FIGS. 2 and 3, a heavy single crystal of semiconductor of 100 kg or greater in weight can be pulled up (i.e., grown) even if the growing single crystal 1 contains the neck 7. Moreover, the heavy single crystal 1 of semiconductor can be grown while the radial and axial concentrations of dopant in the crystal 1 are kept substantially uniform.

SECOND EMBODIMENT

Figure 5:
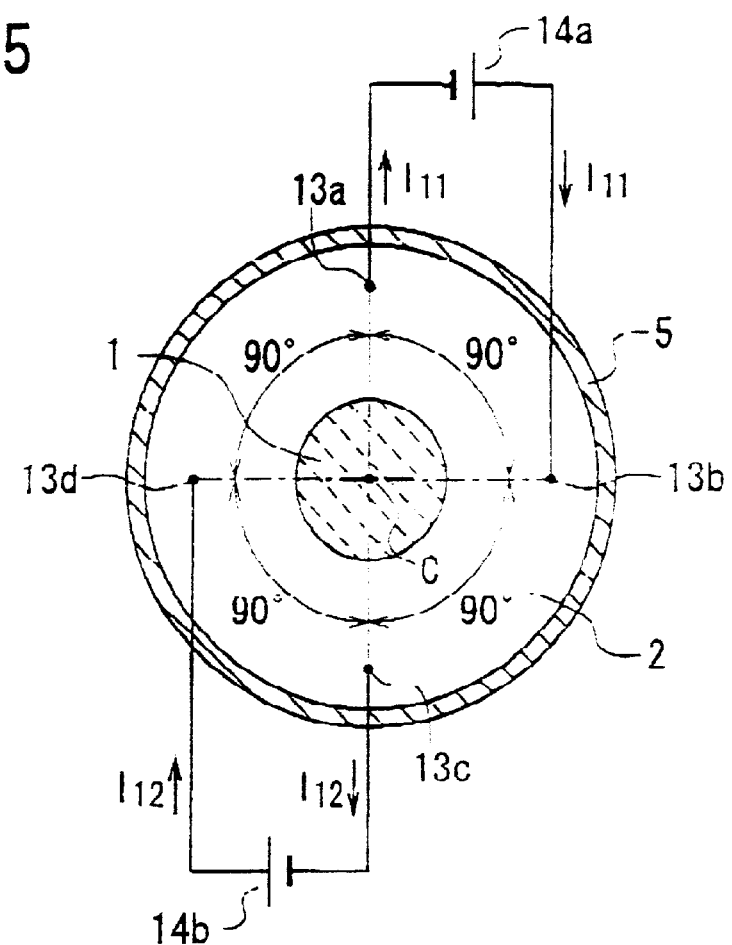
FIG. 5 is a schematic, partial cross-sectional view of a semiconductor crystal growth apparatus according to a second embodiment of the invention, which is taken along the same line as the line III—III in FIG. 2 and which shows the arrangement of the electrodes with respect to the growth axis or pull shaft.

FIG. 5 shows the arrangement of the electrodes with respect to the growth axis C of a semiconductor crystal growth apparatus according to a second embodiment of the invention. This apparatus has the same configuration as the apparatus according to the first embodiment of FIGS. 2 and 3, except that four electrodes 13a, 13b, 13c, and 13d are provided instead of the two electrodes 3a and 3b and two dc power supplies 14a and 14b are provided instead of the dc power supply 4. Therefore, the description about the same configuration is omitted here by attaching the same reference symbols as those in the first embodiment for the sake of simplification of description in FIG. 5.

As seen from FIG. 5, the four electrodes 13a, 13b, 13c, and 13d are arranged vertically near the crucible 5 in such a way as to be located at an angle of 90° with each other around the growth axis C. In other words, the electrodes 13a, 13b, 13c, and 13d are arranged axisymmetrical to the axis C and the shaft 6 and are perpendicular to the surface 2a of the melt 2. The bottoms of the electrodes 13a, 13b, 13c, and 13d are kept being immersed in the melt 2 during the whole growth process, as shown in FIG. 2.

The top end of the electrode 13a is electrically connected to the negative output terminal of the dc power supply 14a. The top end of the electrode 13b is electrically connected to the positive output terminal of the power supply 14a. The top end of the electrode 13c is electrically connected to the negative output terminal of the dc power supply 14b. The top end of the electrode 13d is electrically connected to the positive output terminal of the power supply 14b.

The electrodes 13a and 13b form a first electrode pair. The electrodes 13c and 13d form a second electrode pair. Both the power supplies 14a and 14b are provided outside the furnace 20.

Like the first embodiment, when a specific electric current $I_{11}$ is supplied to the electrodes 13a and 13b with the power supply 14a, an electrical current path (not shown) is formed to interconnect the bottom ends of the electrodes 13a and 13b in the melt 2. The electric current $I_{11}$ flows into the melt 2 through the electrode 13b and flows out of the melt 2 by way of the electrical current path and the electrode 13a. The current $I_{11}$ interacts with the magnetic field H, thereby generating the Lorentz force applying to the melt 2.

Similarly, when a specific electric current $I_{12}$ is supplied to the electrodes 13c and 13d with the power supply 14b, another electrical current path (not shown) is formed to interconnect the bottom ends of the electrodes 13c and 13d in the melt 2. The electric current $I_{12}$ flows into the melt 2 through the electrode 13d and flows out of the melt 2 by way of the electrical current path and the electrode 13c. The current $I_{12}$ interacts with the magnetic field H, thereby generating the Lorentz force applying to the melt 2.

Thus, rotational forces centering on the pulling shaft 6 (i.e., the growth axis C) are generated in the melt 2, causing rotation of the melt 2 around the axis C in the crucible 5. Due to the rotation of the melt 2, the melt 2 itself is stirred. As a result, the radial and axial fluctuation of the dopant concentrations in the grown crystal 1 is uniformized.

Figure 6:
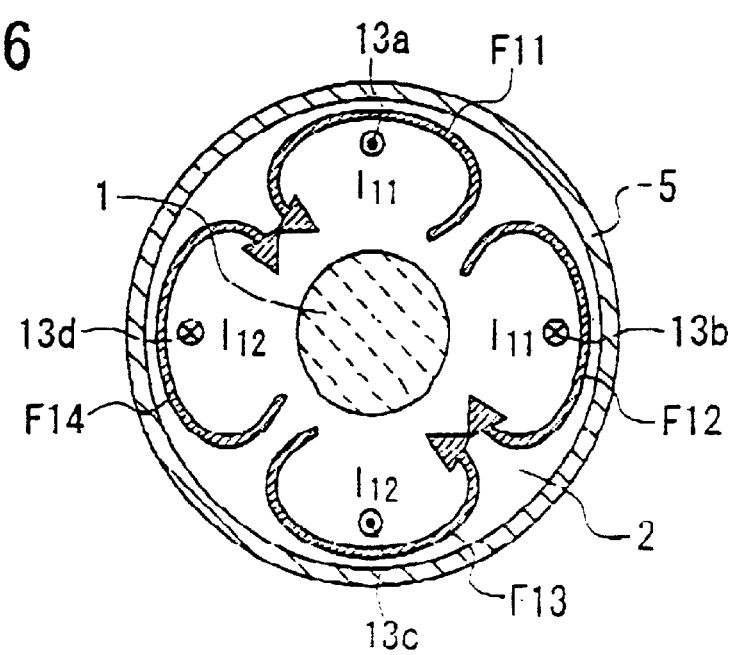
FIG. 6 is a schematic, partial cross-sectional view showing the flowing orientation of the melt of semiconductor in the crucible and the orientation of the electric current flowing through the electrodes in the apparatus according to the second embodiment of FIG. 5.

FIG. 6 shows schematically the observed state of the rotational flow of the melt 2 held in the crucible 5 in the second embodiment. This was given by the same inventors' test as explained in the first embodiment.

As seen from FIG. 6, the two electric currents $I_{11}$ and $I_{12}$ enter vertically the melt 2 by way of the electrodes 13b and 13d and emit vertically from the melt 2 by way of the electrode 13a and 13c, respectively, while the magnetic field H is perpendicular to the surface 2a of the melt 2. Thus, the melt 2 is applied with the Lorentz force due to interaction between the electric currents $I_{11}$ and $I_{12}$ and the magnetic field H, generating the rotational forces centering on the growth axis C in the melt 2. Due to these rotational forces, the rotational flows F11, F12, F13, and F14 of the melt 2 occur around the axis C and the melt 2 is stirred. As a result, the radial and axial fluctuation of the dopant concentration in the grown crystal 1 is uniformized.

With the semiconductor crystal growth apparatus according to the second embodiment of FIG. 5, like the apparatus of the first embodiment of FIGS. 2 and 3, no electric current flows through the growing single crystal 1 containing the neck 7 in the growth process. As a result, the same advantages as those in the first embodiment are given.

In the apparatus according to the second embodiment, the two power supplies 14a and 14b are provided for the supplying respectively the electric currents $I_{11}$ and $I_{12}$ to the first electrode pair (i.e., the electrodes 13a and 13b) and the second electrode pair (i.e., the electrodes 13c and 13d). However, one of the power supplies 14a and 14b may be omitted. In this case, the remaining power supply 14a or 14b supplies the currents $I_{11}$ and $I_{12}$ to the first and second electrode pairs (i.e., the electrodes 13a, 13b, 13c, and 13d).

THIRD EMBODIMENT

Figure 7:
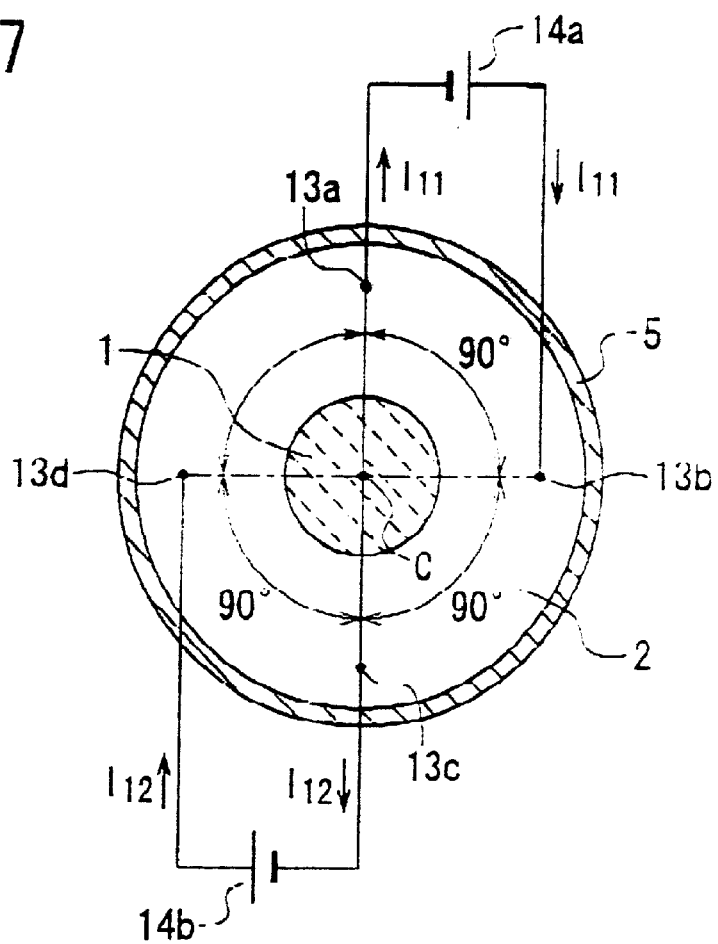
FIG. 7 is a schematic, partial cross-sectional view of a semiconductor crystal growth apparatus according to a third embodiment of the invention, which is taken along the same line as the line III—III in FIG. 2 and which shows the arrangement of the electrodes with respect to the growth axis or pull shaft.

FIG. 7 shows the arrangement of the electrodes with respect to the crucible of a semiconductor crystal growth apparatus according to a third embodiment of the invention. This apparatus has the same configuration as the apparatus according to the second embodiment of FIG. 5, except that the two electrodes 13a and 13c are electrically coupled together. Therefore, the description about the same configuration is omitted here by attaching the same reference symbols as those in the second embodiment for the sake of simplification of description in FIG. 7.

Figure 8:
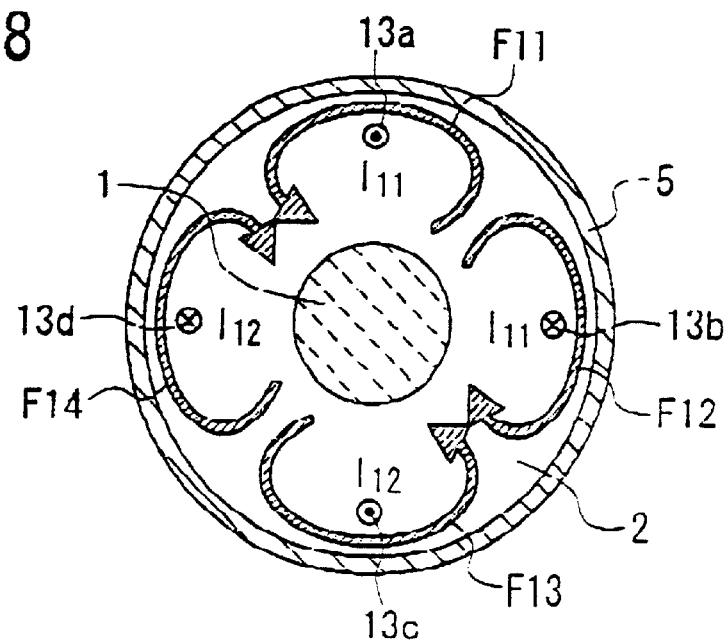
FIG. 8 is a schematic, partial cross-sectional view showing the flowing orientation of the melt of semiconductor in the crucible and the orientation of the electric current flowing through the electrodes in the apparatus according to the third embodiment of FIG. 7.

FIG. 8 shows schematically the observed state of the rotational flow of the melt 2 held in the crucible 5 in the third embodiment. This was given by the same inventors' test as explained in the first embodiment.

As seen from FIG. 8, the melt 2 is applied with the Lorentz force due to interaction between the electric currents $I_{11}$ and $I_{12}$ and the magnetic field H, generating the rotational forces centering on the growth axis C in the melt 2. Due to these rotational forces, the same rotational flows F11, F12, F13, and F14 of the melt 2 as shown in the second embodiment (FIG. 6) occur around the axis C and the melt 2 is stirred.

With the semiconductor crystal growth apparatus according to the third embodiment of FIG. 7, like the apparatuses of the first and second embodiments, no electric current flows through the growing single crystal 1 containing the neck 7 in the growth process. As a result, the same advantages as those in the first embodiment are given.

In the apparatus according to the third embodiment, the two power supplies 14a and 14b are provided for the supplying respectively the electric currents $I_{11}$ and $I_{12}$ to the first electrode pair (i.e., the electrodes 13a and 13b) and the second electrode pair (i.e., the electrodes 13c and 13d). However, one of the power supplies 14a and 14b may be omitted. In this case, the remaining power supply 14a or 14b supplies the currents $I_{11}$ and $I_{12}$ to the first and second electrode pairs.

FOURTH EMBODIMENT

Figure 9:
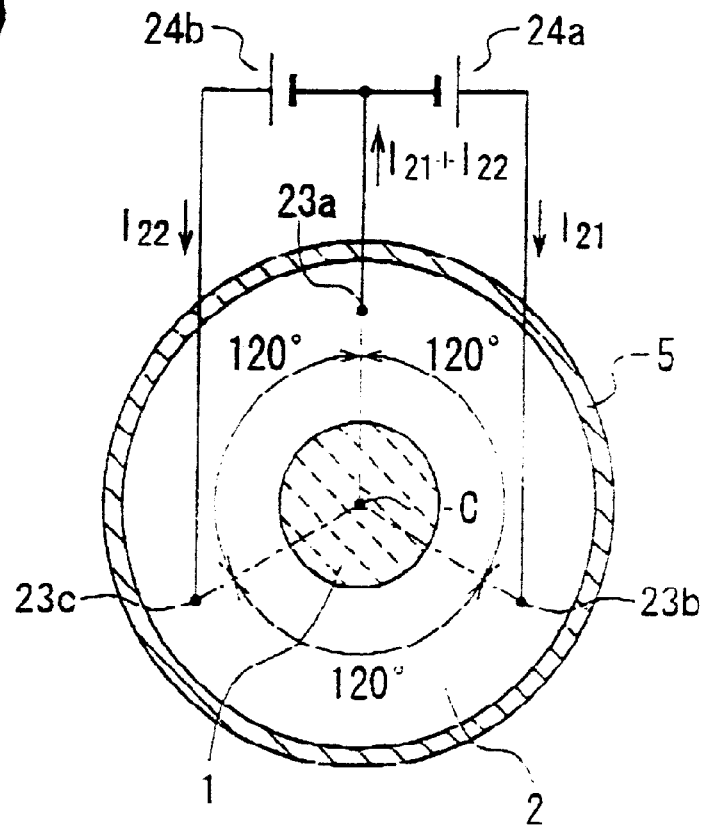
FIG. 9 is a schematic, partial cross-sectional view of a semiconductor crystal growth apparatus according to a fourth embodiment of the invention, which is taken along the same line as the line III—III in FIG. 2 and which shows the arrangement of the electrodes with respect to the growth axis or pull shaft.

FIG. 9 shows the arrangement of the electrodes with respect to the crucible of a semiconductor crystal growth apparatus according to a fourth embodiment of the invention. This apparatus has the same configuration as the apparatus according to the first embodiment of FIGS. 2 and 3, except that three electrodes 23a, 23b, and 23c are provided instead of the electrodes 3a and 3b and two dc power supplies 24a and 24b are provided instead of the dc power supply 4. Therefore, the description about the same configuration is omitted here by attaching the same reference symbols as those in the first embodiment for the sake of simplification of description in FIG. 9.

As seen from FIG. 9, the three electrodes 23a, 23b, and 23c are arranged vertically near the crucible 5 in such a way as to be located at an angle of 120° with each other around the growth axis C. In other words, the electrodes 23a, 23b, and 23c are arranged axisymmetrical to the axis C of the shaft 6 and perpendicular to the surface 2a of the melt 2. The bottoms of the electrodes 23a, 23b, and 23c are kept being immersed in the melt 2 during the whole growth process, as shown in FIG. 2.

The top end of the electrode 23a is electrically connected in common to the negative output terminals of the dc power supplies 24a and 24b. The top end of the electrode 23b is electrically connected to the positive output terminal of the power supply 24a. The top end of the electrode 23c is electrically connected to the positive output terminal of the dc power supply 24b.

Thus, it may be said that the apparatus according to the fourth embodiment of FIG. 9 is equivalent to the apparatus obtained by eliminating one of the coupled electrodes 13a and 13b in the apparatus of the third embodiment of FIG. 7.

When a specific electric current $I_{21}$ is supplied to the electrodes 23a and 23b with the power supply 24a, an electrical current path (not shown) is formed to interconnect the bottom ends of the electrodes 23a and 23b in the melt 2. The electric current $I_{21}$ flows into the melt 2 through the electrode 23b and flows out of the melt 2 by way of the electrical current path and the electrode 23a. The current $I_{21}$ interacts with the magnetic field H, thereby generating the Lorentz force applying to the melt 2.

Similarly, when a specific electric current $I_{22}$ is supplied to the electrodes 23b and 23c with the power supply 24b, another electrical current path (not shown) is formed to interconnect the bottom ends of the electrodes 23b and 23c in the melt 2. The electric current $I_{22}$ flows into the melt 2 through the electrode 23c and flows out of the melt 2 by way of the electrical current path and the electrode 23a. The current $I_{22}$ interacts with the magnetic field H, thereby generating the Lorentz force applying to the melt 2.

Thus, the currents $I_{21}$ and $I_{22}$ flows into the melt 2 by way of the electrodes 23b and 23c, respectively, while the sum current $(I_{21}+I_{22})$ flows out of the melt 2 by way of the electrode 23a.

Figure 10:
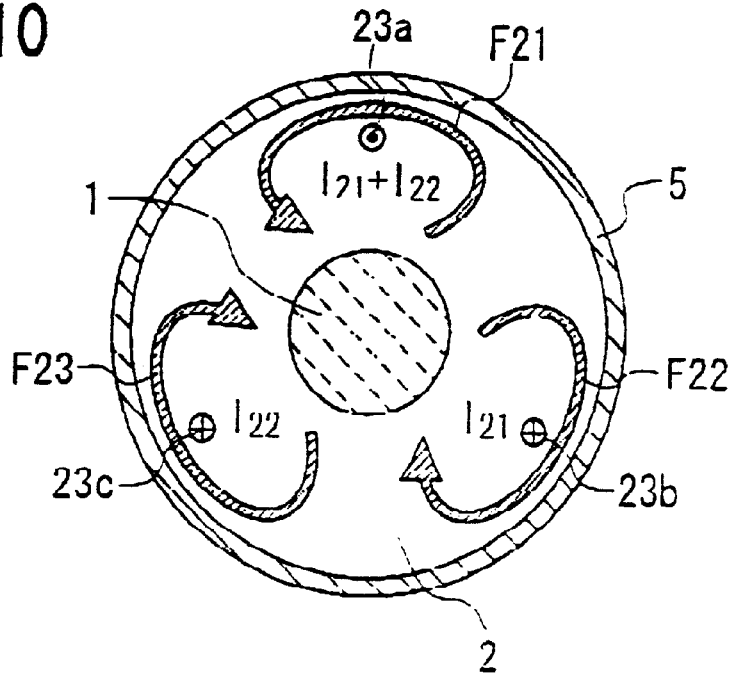
FIG. 10 is a schematic, partial cross-sectional view showing the flowing orientation of the melt of semiconductor in the crucible and the orientation of the electric current flowing through the electrodes in the apparatus according to the fourth embodiment of FIG. 7.

FIG. 10 shows schematically the observed state of the rotational flow of the melt 2 held in the crucible 5 in the fourth embodiment. This was given by the same inventors' test as explained in the first embodiment.

As seen from FIG. 10, the two electric currents $I_{21}$ and $I_{22}$ enter vertically the melt 2 by way of the electrodes 13b and 13d and emit vertically from the melt 2 by way of the electrode 13a and 13c, respectively, while the magnetic field H is perpendicular to the surface 2a of the melt 2. Thus, the melt 2 is applied with the Lorentz force due to interaction between the electric currents $I_{11}$ and $I_{12}$ and the magnetic field H, generating the rotational forces centering on the growth axis C in the melt 2. Due to these rotational forces, the rotational flows F21, F22, and F23 of the melt 2 occur around the axis C and the melt 2 is stirred. As a result, the radial and axial fluctuation of the dopant concentration in the grown crystal 1 is uniformized.

With the semiconductor crystal growth apparatus according to the fourth embodiment of FIG. 9, like the apparatus of the first embodiment, no electric current flows through the growing single crystal 1 containing the neck 7 in the growth process. As a result, the same advantages as those in the first embodiment are given.

In the apparatus according to the fourth embodiment, the two power supplies 24a and 24b are provided for the supplying respectively the electric currents $I_{21}$ and $I_{22}$ to the electrodes 23a and 23b and the electrodes 23c and 23a. However, one of the power supplies 24a and 24b may be omitted. In this case, the remaining power supply 24a or 24b supplies the currents $I_{21}$ and $I_{22}$.

EXAMPLES

To evaluate and confirm the advantages of the invention, the inventors conducted some tests as shown by the following Examples and Comparative Examples.

Examples 1–16

To confirm the advantages that the dopant concentration in the single crystal 1 of semiconductor is substantially uniform and that the crystal 1 of 100 kg or more in weight can be grown, single crystal silicon was grown with the use of the crystal growth apparatus according to the present invention under the following conditions.

In the Examples 1 to 16, first, 150 kg of a silicon melt was produced in the crucible 5 made of fused silica and then, a 20 cm-diameter single-crystal silicon doped with boron (B) as an intended dopant was grown. Each of the electrodes for supplying electric current was formed by a single-crystal silicon of 0.7 cm in diameter. These electrodes were arranged axisymmetrical to the growth axis C in such a way that the bottom ends of the electrodes were immersed in the silicon melt 2 in the crucible 5. The electrodes were located inwardly to be apart from inner wall of the crucible 5 by 10 cm.

Examples 1 to 4

In the Examples 1 to 4, the two electrodes 3a and 3b were located, as shown in FIG. 3. The applied magnetic field H was fixed at 0.03 T, 0.05 T, 0.1 T, or 0.3 T while the electric current was changed according to the length of the growing silicon crystal 1. The result is shown in the following Tables 1A and 1B.

Table 1A shows the intensity of the applied magnetic field H (T), the supplied electric current $I_1$ (A), and the length (cm) of the grown crystal 1. Table 1B shows the radial and axial fluctuation (%) of oxygen concentration and the radial and axial fluctuation (%) of boron concentration of the grown crystal 1.

The radial fluctuation (%) of oxygen or boron was calculated by the difference of the peripheral concentration from the central concentration with respect to the central concentration, which was multiplied by 100 for percentage expression. The axial fluctuation (%) of oxygen or boron was calculated by the difference of the minimum concentration from the maximum concentration with respect to the average concentration, which was multiplied by 100 for percentage expression.

TABLE 1A

|  | MAGNETIC FIELD INTENSITY [T] | ELECTRIC CURRENT [A] | CRYSTAL LENGTH [cm] |
| --- | --- | --- | --- |
| EXAMPLE 1 | 0.03 | 12~16 | 150 |
| EXAMPLE 2 | 0.05 | 10~14 | 150 |
| EXAMPLE 3 | 0.1 | 6~10 | 150 |
| EXAMPLE 4 | 0.3 | 4~8 | 150 |

TABLE 1B

|  | RADIAL FLUCTUATION OF OXYGEN CONCENTRATION [%] | AXIAL FLUCTUATION OF OXYGEN CONCENTRATION [%] | RADIAL FLUCTUATION OF BORON CONCENTRATION [%] | AXIAL FLUCTUATION OF BORON CONCENTRATION [%] |
| --- | --- | --- | --- | --- |
| EXAMPLE 1 | <1 | <5 | <1 | <5 |
| EXAMPLE 2 | <1 | <5 | <1 | <5 |
| EXAMPLE 3 | <1 | <5 | <1 | <5 |
| EXAMPLE 4 | <1 | <5 | <1 | <5 |

Examples 5 to 8

In the Examples 5 to 8, the four electrodes 13a, 13b, 13c, and 13d were located, as shown in FIG. 5. The applied magnetic field H was fixed at 0.03 T, 0.05 T, 0.1 T, or 0.3 T while the electric currents $I_{11}$ and $I_{12}$ were changed according to the length of the growing silicon crystal 1. The result is shown in the following Tables 2A and 2B.

TABLE 2A

|  | MAGNETIC FIELD INTENSITY [T] | ELECTRIC CURRENT [A] | CRYSTAL LENGTH [cm] |
| --- | --- | --- | --- |
| EXAMPLE 5 | 0.03 | 12~16 | 150 |
| EXAMPLE 6 | 0.05 | 10~14 | 150 |
| EXAMPLE 7 | 0.1 | 6~10 | 150 |
| EXAMPLE 8 | 0.3 | 4~8 | 150 |

TABLE 2B

|  | RADIAL FLUCTUATION OF OXYGEN CONCENTRATION [%] | AXIAL FLUCTUATION OF OXYGEN CONCENTRATION [%] | RADIAL FLUCTUATION OF BORON CONCENTRATION [%] | AXIAL FLUCTUATION OF BORON CONCENTRATION [%] |
| --- | --- | --- | --- | --- |
| EXAMPLE 5 | <1 | <5 | <1 | <5 |
| EXAMPLE 6 | <1 | <5 | <1 | <5 |
| EXAMPLE 7 | <1 | <5 | <1 | <5 |
| EXAMPLE 8 | <1 | <5 | <1 | <5 |

Examples 9 to 12

In the Examples 9 to 12, the two electrodes 3a and 3b were located, as shown in FIG. 3. The electric current $I_1$ was fixed at 4A, 8A, 12A, or 16A while the intensity of the magnetic field H was changed according to the length of the growing silicon crystal 1. The result is shown in the following Tables 3A and 3B.

TABLE 3A

|  | ELECTRIC CURRENT [A] | MAGNETIC FIELD INTENSITY [T] | CRYSTAL LENGTH [cm] |
| --- | --- | --- | --- |
| EXAMPLE 9 | 4 | 0.3~0.5 | 150 |
| EXAMPLE 10 | 8 | 0.1~0.4 | 150 |
| EXAMPLE 11 | 12 | 0.08~0.1 | 150 |
| EXAMPLE 12 | 16 | 0.03~0.05 | 150 |

TABLE 3B

|  | RADIAL FLUCTUATION OF OXYGEN CONCENTRATION [%] | AXIAL FLUCTUATION OF OXYGEN CONCENTRATION [%] | RADIAL FLUCTUATION OF BORON CONCENTRATION [%] | AXIAL FLUCTUATION OF BORON CONCENTRATION [%] |
| --- | --- | --- | --- | --- |
| EXAMPLE 9 | <1 | <5 | <1 | <5 |
| EXAMPLE 10 | <1 | <5 | <1 | <5 |
| EXAMPLE 11 | <1 | <5 | <1 | <5 |
| EXAMPLE 12 | <1 | <5 | <1 | <5 |

Examples 13 to 16

In the Examples 13 to 16, the four electrodes 13a, 13b, 13c, and 13d were located, as shown in FIG. 7. The electric current $I_{11}$ and $I_{12}$ were fixed at 4A, 8A, 12A, or 16A while the intensity of the magnetic field H was changed according to the length of the growing silicon crystal. The result is shown in the following Tables 4A and 4B.

TABLE 4A

|  | ELECTRIC CURRENT [A] | MAGNETIC FIELD INTENSITY [T] | CRYSTAL LENGTH [cm] |
| --- | --- | --- | --- |
| EXAMPLE 13 | 4 | 0.3~0.5 | 150 |
| EXAMPLE 14 | 8 | 0.1~0.4 | 150 |
| EXAMPLE 15 | 12 | 0.08~0.1 | 150 |
| EXAMPLE 16 | 16 | 0.03~0.05 | 150 |

TABLE 4B

|  | RADIAL FLUCTUATION OF OXYGEN CONCENTRATION [%] | AXIAL FLUCTUATION OF OXYGEN CONCENTRATION [%] | RADIAL FLUCTUATION OF BORON CONCENTRATION [%] | AXIAL FLUCTUATION OF BORON CONCENTRATION [%] |
| --- | --- | --- | --- | --- |
| EXAMPLE 13 | <1 | <5 | <1 | <5 |
| EXAMPLE 14 | <1 | <5 | <1 | <5 |
| EXAMPLE 15 | <1 | <5 | <1 | <5 |
| EXAMPLE 16 | <1 | <5 | <1 | <5 |

As seen from the test result of the Examples 1 to 16 shown in Tables 1A to 4A and 1B to 4B, the single crystal silicon 1 of 20 cm in diameter and 150 in length, which was as heavy as 110 kg, was able to be grown while the radial oxygen concentrations of oxygen and boron were limited to 1% or less and the axial oxygen concentrations of oxygen and boron were limited to 5% or less.

Examples 17–32

In the following Examples 17 to 32, the diameter of the single crystal 1 of silicon was set at 30 cm, which was larger than the Examples 1 to 16. The single crystal silicon 1 was grown with the use of the crystal growth apparatus according to the present invention under the following conditions.

First, 250 kg of a silicon melt was produced in the crucible 5 made of fused silica and then, a 30 cm-diameter single-crystal silicon 1 doped with boron (B) as an intended dopant was grown. Each of the electrodes for supplying electric current was formed by a cylindrical single-crystal silicon of 1 cm in diameter doped with boron. These electrodes were arranged axisymmetrical to the growth axis C in such a way that the bottom ends of the electrodes were immersed in the silicon melt 2 in the crucible 5. The electrodes were located inwardly to be apart from inner wall of the crucible 5 by 20 cm.

Examples 17 to 20

In the Examples 17 to 20, the two electrodes 3a and 3b were located, as shown in FIG. 3. The intensity of the applied magnetic field H was fixed at 0.03 T, 0.05 T, 0.1 T, or 0.3 T while the electric current $I_1$ was changed according to the length of the growing silicon crystal 1. The result is shown in the following Tables 5A and 5B.

TABLE 5A

|  | MAGNETIC FIELD INTENSITY [T] | ELECTRIC CURRENT [A] | CRYSTAL LENGTH [cm] |
|---|---|---|---|
| EXAMPLE 17 | 0.05 | 16~18 | 100 |
| EXAMPLE 18 | 0.1 | 12~16 | 100 |
| EXAMPLE 19 | 0.3 | 8~12 | 100 |
| EXAMPLE 20 | 0.5 | 4~8 | 100 |

TABLE 5B

|  | RADIAL FLUCTUATION OF OXYGEN CONCENTRATION [%] | AXIAL FLUCTUATION OF OXYGEN CONCENTRATION [%] | RADIAL FLUCTUATION OF BORON CONCENTRATION [%] | AXIAL FLUCTUATION OF BORON CONCENTRATION [%] |
|---|---|---|---|---|
| EXAMPLE 17 | <1 | <5 | <1 | <5 |
| EXAMPLE 18 | <1 | <5 | <1 | <5 |
| EXAMPLE 19 | <1 | <5 | <1 | <5 |
| EXAMPLE 20 | <1 | <5 | <1 | <5 |

Examples 21 to 24

In the Examples 21 to 24, the four electrodes 13a, 13b, 13c, and 13d were located, as shown in FIG. 5. The intensity of the applied magnetic field H was fixed at 0.03 T, 0.05 T, 0.1 T, or 0.3 T while the electric currents $I_{11}$ and $I_{12}$ were changed according to the length of the growing silicon crystal 1. The result is shown in the following Tables 6A and 6B.

TABLE 6A

|  | MAGNETIC FIELD INTENSITY [T] | ELECTRIC CURRENT [A] | CRYSTAL LENGTH [cm] |
|---|---|---|---|
| EXAMPLE 21 | 0.05 | 16~18 | 100 |
| EXAMPLE 22 | 0.1 | 12~16 | 100 |
| EXAMPLE 23 | 0.3 | 8~12 | 100 |
| EXAMPLE 24 | 0.5 | 4~8 | 100 |

TABLE 6B

|  | RADIAL FLUCTUATION OF OXYGEN CONCENTRATION [%] | AXIAL FLUCTUATION OF OXYGEN CONCENTRATION [%] | RADIAL FLUCTUATION OF BORON CONCENTRATION [%] | AXIAL FLUCTUATION OF BORON CONCENTRATION [%] |
|---|---|---|---|---|
| EXAMPLE 21 | <1 | <5 | <1 | <5 |
| EXAMPLE 22 | <1 | <5 | <1 | <5 |
| EXAMPLE 23 | <1 | <5 | <1 | <5 |
| EXAMPLE 24 | <1 | <5 | <1 | <5 |

Examples 25 to 28

In the Examples 25 to 28, the two electrodes 3a and 3b were located, as shown in FIG. 3. The electric current $I_1$ was fixed at 8A, 12A, 16A, or 20A while the intensity of the magnetic field H was changed according to the length of the growing silicon crystal 1. The result is shown in the following Tables 7A and 7B.

TABLE 7A

| | ELECTRIC CURRENT [A] | MEGNETIC FIELD INTENSITY [T] | CRYSTAL LENGTH [cm] |
|---|---|---|---|
| EXAMPLE 25 | 8 | 0.4~0.6 | 100 |
| EXAMPLE 26 | 12 | 0.3~0.5 | 100 |
| EXAMPLE 27 | 16 | 0.1~0.2 | 100 |
| EXAMPLE 28 | 20 | 0.08~0.1 | 100 |

TABLE 7B

| | RADIAL FLUCTUATION OF OXYGEN CONCENTRATION [%] | AXIAL FLUCTUATION OF OXYGEN CONCENTRATION [%] | RADIAL FLUCTUATION OF BORON CONCENTRATION [%] | AXIAL FLUCTUATION OF BORON CONCENTRATION [%] |
|---|---|---|---|---|
| EXAMPLE 25 | <1 | <5 | <1 | <5 |
| EXAMPLE 26 | <1 | <5 | <1 | <5 |
| EXAMPLE 27 | <1 | <5 | <1 | <5 |
| EXAMPLE 28 | <1 | <5 | <1 | <5 |

Examples 29 to 32

In the Examples 29 to 32, the four electrodes 13a, 13b, 13c, and 13d were located, as shown in FIG. 7. The electric currents $I_{11}$ and $I_{12}$ were fixed at 8A, 12A, 16A, or 20A while the intensity of the magnetic field H was changed according to the length of the growing silicon crystal 1. The result is shown in the following Tables 8A and 8B.

TABLE 8A

| | ELECTRIC CURRENT [A] | MAGNETIC FIELD INTENSITY [T] | CRYSTAL LENGTH [cm] |
|---|---|---|---|
| EXAMPLE 29 | 8 | 0.4~0.6 | 100 |
| EXAMPLE 30 | 12 | 0.3~0.5 | 100 |
| EXAMPLE 31 | 16 | 0.1~0.2 | 100 |
| EXAMPLE 32 | 20 | 0.08~0.1 | 100 |

TABLE 8B

| | RADIAL FLUCTUATION OF OXYGEN CONCENTRATION [%] | AXIAL FLUCTUATION OF OXYGEN CONCENTRATION [%] | RADIAL FLUCTUATION OF BORON CONCENTRATION [%] | AXIAL FLUCTUATION OF BORON CONCENTRATION [%] |
|---|---|---|---|---|
| EXAMPLE 29 | <1 | <5 | <1 | <5 |
| EXAMPLE 30 | <1 | <5 | <1 | <5 |
| EXAMPLE 31 | <1 | <5 | <1 | <5 |
| EXAMPLE 32 | <1 | <5 | <1 | <5 |

As seen from the result of the Examples 17 to 32 shown in Tables 5A to 8A and 5B to 8B, a single crystal silicon 1 of 30 cm in diameter and 100 in length, which was as heavy as 165 kg, was able to be grown while the radial oxygen concentrations of oxygen and boron were limited to 1% or less and the axial oxygen concentrations of oxygen and boron were limited to 5% or less.

Examples 33–40

In the following Examples 33 to 40, the diameter of the single crystal 1 of silicon was set at 40 cm, which was larger than the Examples 17 to 32. The silicon 1 was grown with the use of the crystal growth apparatus according to the present invention under the following conditions.

First, 400 kg of a silicon melt was produced in the crucible 5 made of fused silica and then, a 40 cm-diameter single-crystal silicon 1 doped with boron (B) as an intended dopant was grown. Each of the electrodes for supplying electric current was formed by a cylindrical, boron-doped single-crystal silicon of 1.5 cm in diameter. These electrodes were arranged axisymmetrical to the growth axis C in such a way that the bottom ends of the electrodes were immersed in the silicon melt 2 in the crucible 5. The electrodes were located inwardly to be apart from inner wall of the crucible 5 by 30 cm.

Examples 33 to 35

In the Examples 33 to 35, the four electrodes 13a, 13b, 13c, and 13d were located, as shown in FIG. 5. The intensity of the applied magnetic field H was fixed at 0.3 T, 0.5 T, or 0.7 T while the electric currents $I_{11}$ and $I_{12}$ were changed according to the length of the growing silicon crystal 1. The result is shown in the following Tables 9A and 9B.

TABLE 9A

| | MAGNETIC FIELD INTENSITY [T] | ELECTRIC CURRENT [A] | CRYSTAL LENGTH [cm] |
|---|---|---|---|
| EXAMPLE 33 | 0.3 | 16~18 | 80 |
| EXAMPLE 34 | 0.5 | 12~16 | 80 |
| EXAMPLE 35 | 0.7 | 8~12 | 80 |

TABLE 9B

| | RADIAL FLUCTUATION OF OXYGEN CONCENTRATION [%] | AXIAL FLUCTUATION OF OXYGEN CONCENTRATION [%] | RADIAL FLUCTUATION OF BORON CONCENTRATION [%] | AXIAL FLUCTUATION OF BORON CONCENTRATION [%] |
|---|---|---|---|---|
| EXAMPLE 33 | <1 | <5 | <1 | <5 |
| EXAMPLE 34 | <1 | <5 | <1 | <5 |
| EXAMPLE 35 | <1 | <5 | <1 | <5 |

Examples 36 to 38

In the Examples 36 to 38, the four electrodes 13a, 13b, 13c, and 13d were located, as shown in FIG. 7. The applied electric currents $I_{11}$ and $I_{12}$ were fixed at 12A, 16A, or 20A while the intensity of the magnetic field H was changed according to the length of the growing silicon crystal 1 The result is shown in the following Tables 10A and 10B.

TABLE 10A

| | ELECTRIC CURRENT [A] | MAGNETIC FIELD INTENSITY [T] | CRYSTAL LENGTH [cm] |
|---|---|---|---|
| EXAMPLE 36 | 12 | 0.5~0.7 | 80 |
| EXAMPLE 37 | 16 | 0.4~0.6 | 80 |
| EXAMPLE 38 | 20 | 0.1~0.3 | 80 |

TABLE 10B

| | RADIAL FLUCTUATION OF OXYGEN CONCENTRATION [%] | AXIAL FLUCTUATION OF OXYGEN CONCENTRATION [%] | RADIAL FLUCTUATION OF BORON CONCENTRATION [%] | AXIAL FLUCTUATION OF BORON CONCENTRATION [%] |
|---|---|---|---|---|
| EXAMPLE 36 | <1 | <5 | <1 | <5 |
| EXAMPLE 37 | <1 | <5 | <1 | <5 |
| EXAMPLE 38 | <1 | <5 | <1 | <5 |

As seen from the result of the Examples 33 to 38 shown in Tables 9A to 10A and 9B to 10B, single crystal silicon of 40 cm in diameter and 80 cm in length, which was as heavy as 235 kg, was able to be grown while the radial oxygen concentrations of oxygen and boron were limited to 1% or less and the axial oxygen concentrations of oxygen and boron were limited to 5% or less.

Comparative Examples 1–10

In the following Comparative Examples 1 to 10, a boron-doped single crystal silicon of 20 cm or 40 cm in diameter was grown under the following conditions with the use of the conventional crystal growth apparatus where the rotation and pull-up of the crucible was mechanically controlled.

For the 20 cm-diameter silicon crystal, 150 kg of a silicon melt was produced in the crucible made of fused silica and then, a single-crystal silicon doped with boron as an intended dopant was grown. The rotation rate of the crucible was set within the range from 1 rpm to at 20 rpm.

For the 40 cm-diameter silicon crystal, 400 kg of a silicon melt was produced in a crucible made of fused silica and then, a single-crystal silicon doped with boron as an intended dopant was grown. The rotation rate of the crucible was set within the range from 1 rpm to at 20 rpm.

The result is shown in the following Tables 11A and 11B.

TABLE 11A

| | CRYSTAL DIAMETER [cm] | CRYSTAL LENGTH [cm] | CRUCIBLE ROTATION RATE [cm] |
|---|---|---|---|
| COMPARATIVE EXAMPLE 1 | 20 | 150 | 0.5 |
| COMPARATIVE EXAMPLE 2 | 20 | 150 | 1 |
| COMPARATIVE EXAMPLE 3 | 20 | 150 | 5 |
| COMPARATIVE EXAMPLE 4 | 20 | 150 | 10 |
| COMPARATIVE EXAMPLE 5 | 20 | 150 | 15 |

TABLE 11A-continued

| | CRYSTAL DIAMETER [cm] | CRYSTAL LENGTH [cm] | CRUCIBLE ROTATION RATE [cm] |
|---|---|---|---|
| COMPARATIVE EXAMPLE 6 | 40 | 80 | 0.5 |
| COMPARATIVE EXAMPLE 7 | 40 | 80 | 1 |

TABLE 11A-continued

| | CRYSTAL DIAMETER [cm] | CRYSTAL LENGTH [cm] | CRUCIBLE ROTATION RATE [cm] |
|---|---|---|---|
| COMPARATIVE EXAMPLE 8 | 40 | 80 | 5 |
| COMPARATIVE EXAMPLE 9 | 40 | 80 | 10 |
| COMPARATIVE EXAMPLE 10 | 40 | 80 | 15 |

TABLE 11B

| | RADIAL FLUCTUATION OF OXYGEN CONCENTRATION [%] | RADIAL FLUCTUATION OF BORON CONCENTRATION [%] | AXIAL FLUCTUATION OF OXYGEN CONCENTRATION [%] | AXIAL FLUCTUATION OF BORON CONCENTRATION [%] |
|---|---|---|---|---|
| COMPARATIVE EXAMPLE 1 | 10 | 20 | 15 | 25 |
| COMPARATIVE EXAMPLE 2 | 5 | 10 | 10 | 15 |
| COMPARATIVE EXAMPLE 3 | 5 | 7 | 10 | 12 |
| COMPARATIVE EXAMPLE 4 | 2 | 5 | 7 | 10 |
| COMPARATIVE EXAMPLE 5 | 15 | 2 | 6.5 | 7 |
| COMPARATIVE EXAMPLE 6 | 20 | 25 | 25 | 30 |
| COMPARATIVE EXAMPLE 7 | 12 | 15 | 17 | 20 |
| COMPARATIVE EXAMPLE 8 | 6 | 10 | 11 | 15 |
| COMPARATIVE EXAMPLE 9 | 5 | 7 | 10 | 12 |
| COMPARATIVE EXAMPLE 10 | 2 | 4 | 7 | 9 |

As seen from the result of the Comparative Examples 1 to 10 shown in Tables 11A and 11B, a single crystal silicon of 20 cm in diameter, 150 in length, and in 110 kg in weight, and a single crystal silicon of 40 cm in diameter, 80 in length, and in 235 kg in weight, were able to be grown. However, both the radial and axial oxygen concentrations of oxygen and boron had large, unacceptable fluctuation.

Comparative Examples 11–14

In the following Comparative Examples 11 to 14, a boron-doped single crystal silicon of 20 cm in diameter was grown under the following conditions with the use of the prior-art crystal growth apparatus shown in FIG. 1.

200 kg of a silicon melt was produced in the crucible 105 made of fused silica and then, a single-crystal silicon 101 doped with boron (B) as an intended dopant was grown. Each of the two electrodes 103 for supplying electric current was formed by a single-crystal silicon of 0.7 cm in diameter. These electrodes 103 were arranged axisymmetrical to the growth axis in such a way that the bottom ends of the electrodes 103 were immersed in the silicon melt 102 in the crucible 105. The electrodes 103 were located inwardly to be apart from inner wall of the crucible 105 by 10 cm.

The intensity of the applied magnetic field H was fixed at 0.03 T, 0.05 T, 0.1 T, or 0.3 T while the electric current was changed according to the length of the growing silicon crystal 101.

The result is shown in the following Tables 12A and 12B.

TABLE 12A

| | MAGNETIC FIELD INTENSITY [T] | ELECTRIC CURRENT [A] | CRYSTAL LENGTH [cm] |
|---|---|---|---|
| COMPARATIVE EXAMPLE 11 | 0.03 | 12~16 | 110 |
| COMPARATIVE EXAMPLE 12 | 0.05 | 10~14 | 110 |
| COMPARATIVE EXAMPLE 13 | 0.1 | 6~10 | 110 |
| COMPARATIVE EXAMPLE 14 | 0.3 | 4~8 | 110 |

TABLE 12B

| | RADIAL FLUCTUATION OF OXYGEN CONCENTRATION [%] | RADIAL FLUCTUATION OF BORON CONCENTRATION [%] | AXIAL FLUCTUATION OF OXYGEN CONCENTRATION [%] | AXIAL FLUCTUATION OF BORON CONCENTRATION [%] |
|---|---|---|---|---|
| COMPARATIVE EXAMPLE 11 | <1 | <1 | <5 | <5 |
| COMPARATIVE EXAMPLE 12 | <1 | <1 | <5 | <5 |
| COMPARATIVE EXAMPLE 13 | <1 | <1 | <5 | <5 |
| COMPARATIVE EXAMPLE 14 | <1 | <1 | <5 | <5 |

Comparative Examples 15–17

In the following Comparative Examples 15 to 17, boron-doped single crystal silicon of 40 cm in diameter was grown under the following conditions with the use of the prior-art crystal growth apparatus shown in FIG. 1.

400 kg of silicon melt was produced in the crucible 105 made of fused silica and then, a single-crystal silicon 101 doped with boron (B) as an intended dopant was grown. Each of the four electrodes 103 for supplying electric current was formed by a cylindrical single-crystal silicon of 1.5 cm in diameter. These electrodes 103 were arranged axisymmetrical to the growth axis in such a way that the bottom ends of the electrodes 103 were immersed in the silicon melt 102 in the crucible 105. The electrodes 103 were located inwardly to be apart from inner wall of the crucible 105 by 30 cm.

The intensity of the applied magnetic field H was fixed at 0.3 T, 0.5 T, or 0.7 T while the electric current was changed according to the length of the growing silicon crystal 101.

The result is shown in the following Tables 13A and 13B.

TABLE 13A

| | MAGNETIC FIELD INTENSITY [T] | ELECTRIC CURRENT [A] | CRYSTAL LENGTH [cm] |
|---|---|---|---|
| COMPARATIVE EXAMPLE 15 | 0.3 | 16~18 | 30 |
| COMPARATIVE EXAMPLE 16 | 0.5 | 12~16 | 30 |

TABLE 13A-continued

|  | MAGNETIC FIELD INTENSITY [T] | ELECTRIC CURRENT [A] | CRYSTAL LENGTH [cm] |
|---|---|---|---|
| COMPARATIVE EXAMPLE 17 | 0.7 | 8~12 | 30 |

TABLE 13B

|  | RADIAL FLUCTUATION OF OXYGEN CONCENTRATION [%] | RADIAL FLUCTUATION OF BORON CONCENTRATION [%] | AXIAL FLUCTUATION OF OXYGEN CONCENTRATION [%] | AXIAL FLUCTUATION OF BORON CONCENTRATION [%] |
|---|---|---|---|---|
| COMPARATIVE EXAMPLE 15 | <1 | <1 | <5 | <5 |
| COMPARATIVE EXAMPLE 16 | <1 | <1 | <5 | <5 |
| COMPARATIVE EXAMPLE 17 | <1 | <1 | <5 | <5 |

As seen from the result of the Comparative Examples 11 to 17 shown in Tables 13A and 13B, single crystal silicon was able to be grown while the radial oxygen concentrations of oxygen and boron were limited to 1% or less and the axial oxygen concentrations of oxygen and boron were limited to 5% or less. However, the possible length and weight of the grown crystal 101 was limited to 110 cm or less and 80 kg or less for the diameter of 20 cm and to 30 cm or less and 88 kg or less for the diameter of 40 cm.

Thus, it was confirmed that single crystal silicon of 100 kg or more in weight was unable to be grown with the prior-art apparatus shown in FIG. 1.

VARIATIONS

Although the preferred embodiments and examples are explained so far, it is needless to say that the invention is not limited to these embodiments and examples and any variation is applicable thereto.

For example, the count and arrangement of the electrodes for supplying electric current to the melt of semiconductor may be optionally changed as necessary. Also, the applied magnetic field, the supplied electric current, and their changing rates during the growth process may be optionally changed as necessary.

In the above-described Examples, one of the magnetic field intensity and the electric current is adjusted; however, both of them may be adjusted simultaneously.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of growing a single crystal of semiconductor using the Czochralski method, comprising the steps of:
   (a) providing a melt of semiconductor held in a crucible using a heater;
   (b) providing a power supply having a first terminal and a second terminal;
   (c) providing a first electrode having a first end and a second end in such a way that the first end of the first electrode is electrically connected to the first terminal of the power supply and the second end of the first electrode contacts the melt held in the crucible;
   (d) providing a second electrode having a first end and a second end in such a way that the first end of the second electrode is electrically connected to the second terminal of the power supply and the second end of the second electrode contacts the melt held in the crucible;
   (e) applying a specific voltage across the first ends of the first and second electrodes with the power supply, thereby forming an electrical current path interconnecting the second ends of the first and second electrodes in the melt held in the crucible;
   (f) generating a magnetic field to intersect with the electrical current path formed in the melt held in the crucible;
   (g) pulling up a seed crystal from the melt held in the crucible along a specific growth axis, thereby growing a single crystal of semiconductor from the melt while a neck is formed between the seed crystal and a head end of the growing single crystal.

2. The method according to claim 1, wherein no electric current is supplied to the single crystal during a whole growth process of the single crystal.

3. The method according to claim 1, wherein at least one of an electric current flowing through the electric current path formed in the melt and the magnetic field generated in the melt is adjusted to uniformize a dopant concentration in the single crystal in the growth process of the single crystal.

4. The method according to claim 1, wherein the second ends of the first and second electrodes are contacted with a surface of the melt held in the crucible;
   and wherein the magnetic field generated with the magnetic field generator is approximately perpendicular to the surface of the melt.

5. The method according to claim 1, wherein the first and second electrodes are arranged to be axisymmetrical to a growth axis of the single crystal.

6. The method according to claim 1, wherein the first and second electrodes are made of a same material as the single crystal of semiconductor.

7. The method according to claim 6, wherein the first and second electrodes are doped with a same dopant as the single crystal of semiconductor.

8. The method according to claim 1, wherein the magnetic field generated with the magnetic field generator is approximately axisymmetrical to a growth axis of the single crystal.

9. The method according to claim 1, further comprising the steps of:
   (h) providing a second power supply having a first terminal and a second terminal;
   (i) providing a third electrode having a first end and a second end;
      the first end of the third electrode being electrically connected to the first terminal of the second power supply;
      the second end of the third electrode being designed to contact the melt held in the crucible; and
   (j) providing a fourth electrode having a first end and a second end;
      the first end of the fourth electrode being electrically connected to the second terminal of the second power supply;
      the second end of the fourth electrode being designed to contact the melt held in the crucible.

10. The method according to claim 9, wherein the second ends of the first, second, third, and fourth electrodes are contacted with a surface of the melt held in the crucible;

and wherein the magnetic field generated with the magnetic field generator is approximately perpendicular to the surface of the melt.

11. The method according to claim 9, wherein the first, second, third, and fourth electrodes are arranged to be axisymmetrical to a growth axis of the apparatus.

12. The method according to claim 9, wherein the first, second, third, and fourth electrodes are made of a same material as the single crystal of semiconductor.

13. The method according to claim 9, wherein the first, second, third, and fourth electrodes are doped with a same dopant as the single crystal of semiconductor.

14. The method according to claim 9, wherein the magnetic field generated with the magnetic field generator is approximately axisymmetrical to a growth axis of the single crystal.

15. The method according to claim 1, further comprising the step of:

(h) providing at least one additional electrode having a first end and a second end;

the first end of the additional electrode being electrically connected to the first terminal of the first power supply; and the second end of the additional electrode being designed to contact the melt held in the crucible.

16. A method of growing a single crystal of semiconductor using the Czochralski method, comprising the steps of:

(a) providing a melt of semiconductor held in a crucible using a heater;

(b) generating a magnetic field to intersect with the electrical current path formed in the melt held in the crucible; and (c) pulling up a seed crystal from the melt held in the crucible along a specific growth axis, thereby growing a single crystal of semiconductor from the melt while a neck is formed between the seed crystal and a head end of the growing single crystal.

characterizing in that (d) providing a power supply having a first terminal and a second terminal;

(e) providing a first electrode having a first end and a second end in such a way that the first end of the first electrode is electrically connected to the first terminal of the power supply and the second end of the first electrode contacts the melt held in the crucible;

(f) providing a second electrode having a first end and a second end in such a way that the first end of the second electrode is electrically connected to the second terminal of the power supply and the second end of the second electrode contacts the melt held in the crucible; and (g) applying a specific voltage across the first ends of the first and second electrodes with the power supply, thereby forming an electrical current path interconnecting the second ends of the first and second electrodes in the melt held in the crucible.

17. An apparatus for growing a single crystal of semiconductor using the Czochralski method, comprising:

(a) a crucible for holding a melt of semiconductor;

(b) a heater for heating the crucible;

(c) a pulling mechanism for pulling up a single crystal of semiconductor from the melt held in the crucible using a seed crystal;

(d) a first power supply having a first terminal and a second terminal;

(e) a first electrode being electrically connected to the first terminal of the first power supply and being designed to contact the melt held in the crucible;

(f) a second electrode being electrically connected to the second terminal of the first power supply and being designed to contact the melt held in the crucible;

(g) a magnetic field generator for generating a magnetic field in the melt held in the crucible;

wherein in a growth process, a specific voltage is applied across the first and second electrodes with the power supply, thereby forming an electrical current path interconnecting the first and second electrodes in the melt held in the crucible;

wherein the magnetic field intersects with the electrical current path in the melt held in the crucible in the growth process;

and wherein the single crystal is grown to form a neck between the seed crystal and a head end of the single crystal.

18. The apparatus according to claim 17, wherein the second ends of the first and second electrodes are designed to contact with a surface of the melt held in the crucible;

and wherein the magnetic field generated with the magnetic field generator is approximately perpendicular to the surface of the melt.

19. The apparatus according to claim 17, wherein the first and second electrodes are arranged to be axisymmetrical to a growth axis of the single crystal.

20. The apparatus according to claim 17, wherein the first and second electrodes are made of a same material as the single crystal of semiconductor.

21. The apparatus according to claim 20, wherein the first and second electrodes are doped with a same dopant as the single crystal of semiconductor.

22. The apparatus according to claim 17, wherein the magnetic field generated with the magnetic field generator is approximately axisymmetrical to a growth axis of the single crystal.

23. The apparatus according to claim 17, further comprising (h) a second power supply having a first terminal and a second terminal;

(i) a third electrode having a first end and a second end;

the first end of the third electrode being electrically connected to the first terminal of the second power supply;

the second end of the third electrode being designed to contact the melt held in the crucible; and (j) a fourth electrode having a first end and a second end;

the first end of the fourth electrode being electrically connected to the second terminal of the second power supply;

the second end of the fourth electrode being designed to contact the melt held in the crucible.

24. The apparatus according to claim 23, wherein the second ends of the first, second, third, and fourth electrodes are designed to contact with a surface of the melt held in the crucible;

and wherein the magnetic field generated with the magnetic field generator is approximately perpendicular to the surface of the melt.

25. The apparatus according to claim 23, wherein the first, second, third, and fourth electrodes are arranged to be axisymmetrical to a growth axis of the apparatus.

26. The apparatus according to claim 23, wherein the first, second, third, and fourth electrodes are made of a same material as the single crystal of semiconductor.

27. The apparatus according to claim 26, wherein the first, second, third, and fourth electrodes are doped with a same dopant as the single crystal of semiconductor.

28. The apparatus according to claim 23, wherein the magnetic field generated with the magnetic field generator is approximately axisymmetrical to a growth axis of the single crystal.

29. The apparatus according to claim 17, further comprising
  (h) at least one additional electrode having a first end and a second end;
    the first end of the additional electrode being electrically connected to the first terminal of the first power supply; and
    the second end of the additional electrode being designed to contact the melt held in the crucible.

30. An apparatus for growing a single crystal of semiconductor using the Czochralski method comprising:
  (a) a crucible for holding a melt of semiconductor;
  (b) a heater for heating the crucible;
  (c) a pulling mechanism for pulling up a single crystal of semiconductor from the melt held in the crucible using a seed crystal; and
  (d) a magnetic field generator for generating a magnetic field in the melt held in the crucible;
  (e) the single crystal being grown to form a neck between the seed crystal and a head end of the single crystal; characterizing in that
  (f) a first power supply having a first terminal and a second terminal;
  (g) a first electrode having a first end and a second end;
    the first end of the first electrode being electrically connected to the first terminal of the first power supply;
    the second end of the first electrode being designed to contact the melt held in the crucible;
  (h) a second electrode having a first end and a second end;
    the first end of the second electrode being electrically connected to the second terminal of the first power supply;
    the second end of the second electrode being designed to contact the melt held in the crucible;
  (i) in a growth process, a specific voltage being applied across the first ends of the first and second electrodes with a power supply, thereby forming an electrical current path interconnecting the second ends of the first and second electrodes in the melt held in the crucible.

31. An apparatus for growing a single crystal of semiconductor using the Czochralski method, comprising;
  (a) a crucible holding a melt of semiconductor;
  (b) a heater for heating the crucible;
  (c) a pulling mechanism for pulling up a single crystal of semiconductor from the melt held in the crucible using a seed crystal;
  (d) a first power supply having a first terminal and a second terminal;
  (e) a first electrode being electrically connected to the first terminal of the first power supply and
  (f) a second electrode being electrically connected to the second terminal of the first power supply;
  (g) a magnetic field generator generating a magnetic field in the melt held in the crucible;
    wherein in a growth process, a specific voltage is applied across the first and second electrodes with the power supply, thereby forming an electrical current path interconnecting the first and second electrodes in the melt held in the crucible;
    wherein the single crystal is grown to form a neck between the seed crystal and a head end of the single crystal;
    wherein the second ends of the first and second electrodes are designed to contact with the surface of the melt held in the crucible;
    and wherein the magnetic field generated with the magnetic field generator is approximately perpendicular to the surface of the melt.

32. The apparatus according to claim 31, wherein the first and second electrodes are arranged to be axisymmetrical to a growth axis of the single crystal.

33. The apparatus according to claim 31, wherein the first and second electrodes are made of a same material as the single crystal of semiconductor.

34. The apparatus according to claim 33, wherein the first and second electrodes are doped with a same dopant as the single crystal of semiconductor.

35. The apparatus according to claim 31, wherein the magnetic field generated with the magnetic field generator is approximately axisymmetrical to a growth axis of the single crystal.

36. The apparatus according to claim 31, further comprising
  (h) a second power supply having a first terminal and a second terminal;
  (i) a third electrode having a first end of a second end;
    the first end of the third electrode being electrically connected to the first terminal of the second power supply;
    the second end of the third electrode being designed to contact the melt held in the crucible; and
  (j) a fourth electrode having a first end and a second end;
    the first end of the fourth electrode being electrically connected to the second terminal of the second power supply;
    the second end of the fourth electrode being designed to contact the melt held in the crucible.

37. The apparatus according to claim 36, wherein the second ends of the first, second, third, and fourth electrodes are designed to contact with a surface of the melt held in the crucible;
    and wherein the magnetic field generated with the magnetic field generator is approximately perpendicular to the surface of the melt.

38. The apparatus according to claim 36, wherein the first, second, third, and fourth electrodes are arranged to be axisymmetrical to a growth axis of the apparatus.

39. The apparatus according to claim 36, wherein the first, second, third, and fourth electrodes are made of a same material as the single crystal of semiconductor.

40. The apparatus according to claim 39, wherein the first, second, third, and fourth electrodes are doped with a same dopant as the single crystal of semiconductor.

41. The apparatus according to claim 36, wherein the magnetic field generated with the magnetic field generator is approximately axisymmetrical to a growth axis of the single crystal.

42. The apparatus according to claim 31 further comprising:
  (h) at least one additional electrode having a first end and a second end;
    the first end of the additional electrode being electrically connected to the first terminal of the first power supply; and
    the second end of the additional electrode being designed to contact the melt held in the crucible.

* * * * *